United States Patent
Zhang et al.

(10) Patent No.: US 11,942,443 B2
(45) Date of Patent: Mar. 26, 2024

(54) ARRAY SUBSTRATE, DISPLAY PANEL AND DISPLAY DEVICE

(71) Applicants: Hefei BOE Display Technology Co., Ltd., Anhui (CN); BOE Technology Group Co., Ltd., Beijing (CN)

(72) Inventors: Chunxu Zhang, Beijing (CN); Xiaoting Jiang, Beijing (CN); Min Cheng, Beijing (CN); Maoxiu Zhou, Beijing (CN); Haipeng Yang, Beijing (CN); Ke Dai, Beijing (CN)

(73) Assignees: Hefei BOE Display Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 349 days.

(21) Appl. No.: 17/507,655

(22) Filed: Oct. 21, 2021

(65) Prior Publication Data
US 2022/0293539 A1  Sep. 15, 2022

(30) Foreign Application Priority Data
Mar. 11, 2021  (CN) .......................... 202120515544.7

(51) Int. Cl.
H01L 23/00 (2006.01)
(52) U.S. Cl.
CPC .............. *H01L 24/06* (2013.01); *H01L 24/05* (2013.01); *H01L 2224/05073* (2013.01); *H01L 2224/05083* (2013.01); *H01L 2224/05124* (2013.01); *H01L 2224/05147* (2013.01); *H01L 2224/05166* (2013.01); *H01L 2224/05179* (2013.01); *H01L 2224/0518* (2013.01); *H01L 2224/05186* (2013.01); *H01L 2224/05563* (2013.01); *H01L 2224/05573* (2013.01); *H01L 2224/05686* (2013.01); *H01L 2224/06155* (2013.01); *H01L 2224/06517* (2013.01)

(58) Field of Classification Search
CPC ..................... H01L 24/06; H01L 24/05; H01L 2224/05073; H01L 2224/05083; H01L 2224/05124; H01L 2224/05147; H01L 2224/05166; H01L 224/05179
USPC .......................................... 361/783
See application file for complete search history.

(56) References Cited

U.S. PATENT DOCUMENTS 6,222,737 B1 * 4/2001 Ross ...................... H05K 1/181
                                                        361/767
2006/0071316 A1 * 4/2006 Garth ...................... H01L 25/50
                                                        257/E21.705

* cited by examiner

Primary Examiner — Andargie M Aychillhum
(74) Attorney, Agent, or Firm — IPro, PLLC

(57) ABSTRACT

Provided is an array substrate. The array substrate includes at least one pad group disposed in a peripheral region of a base substrate, wherein the at least one pad group includes a sector pad group in which the pads are distributed in a sector shape. Therefore, the bonding yield between the array substrate and the circuit board is increased.

19 Claims, 3 Drawing Sheets

ARRAY SUBSTRATE, DISPLAY PANEL AND DISPLAY DEVICE

CROSS-REFERENCE TO RELATED APPLICATION

This application is based on and claims priority to Chinese Patent Application No. 202120515544.7, filed on Mar. 11, 2021 and entitled "ARRAY SUBSTRATE, DISPLAY PANEL AND DISPLAY DEVICE," the disclosure of which is herein incorporated by reference in its entirety.

TECHNICAL FIELD

The present disclosure relates to the field of display technologies, and in particular, relates to an array substrate, a display panel, and a display device.

BACKGROUND

In a high-resolution display panel, a large number of data signal lines are densely disposed. Correspondingly, pins on the chip on film (COF) bound to the display panel also need to be densely disposed.

It should be noted that the information disclosed in above background section is only for better understanding the background of the embodiments of the present disclosure, and therefore does not constitute the related art known to those of ordinary skill in the art.

SUMMARY

Various embodiments of the present disclosure are intended to provide an array substrate, a display panel, and a display device.

According to one aspect of the embodiments of the present disclosure, an array substrate is provided. The array substrate includes:

a base substrate, wherein the base substrate includes a display region and a peripheral region surrounding the display region; and at least one pad group disposed in the peripheral region, wherein each of the at least one pad group includes a plurality of pads sequentially arranged along a first direction, the at least one pad group includes a sector pad group, and the pads in the sector pad group are distributed in a sector shape.

In some embodiments, the first direction is parallel to a bearing surface of the base substrate and an extension direction of any side of the base substrate.

In some embodiment, in the sector pad group, a distance between any two adjacent pads at an end proximal to the display region is not greater than a distance between the two pads at an end distal from the display region.

In some embodiments, an angle defined between extension directions of any two adjacent pads in the sector pad group is a target angle.

In some embodiments, in the sector pad group, an angle defined between extension directions of two pads disposed at both ends ranges from 10 degrees to 20 degrees.

In some embodiments, an angle defined between the extension direction of the pad at any end and a second direction ranges from 5 degrees to 10 degrees, wherein the second direction is parallel to a bearing surface of the base substrate and perpendicular to the first direction.

In some embodiments, in the sector pad group, any one of the pads includes a first edge and a second edge that are oppositely disposed and extended along the first direction, and the first edge is more proximal to the display region relative to the second edge; and in the any two adjacent pads, a dimension of the first edge of the pad distal from a central axis of the sector pad group is greater than a dimension of the first edge of the pad proximal to the central axis of the sector pad group.

In some embodiments, in the sector pad group, a dimension of the first edge of the pad disposed at any end is 2 μm to 6 μm greater than a dimension of the first edge of the pad most proximal to the central axis of the sector pad group.

In some embodiments, a length of the first edge ranges from 25 μm to 35 μm.

In some embodiments, in the sector pad group, a distance between a center of the first edge of one pad and a center of the first edge of the other pad in one pair of adjacent pads is equal to a distance between a center of the first edge of one pad and a center of the first edge of the other pad in another pair of adjacent pads.

In some embodiments, in the sector pad group, the first edges of the pads are in a same line, and the second edges of the pads are in a same line.

In some embodiments, in the sector pad group, any one of the pads further includes a third edge and a fourth edge that are oppositely disposed to be parallel to each other, the third edge is connected to one end of the first edge and one end of the second edge, and the fourth edge is connected to the other end of the first edge and the other end of the second edge.

In some embodiments, each of the pads of the sector pad group includes a metal layer, an insulating layer, and a conductive adhesion layer stacked sequentially along a direction away from the base substrate, an orthographic projection of the metal layer onto the base substrate covers an orthographic projection of the conductive adhesion layer onto the base substrate; and at least one of the pads of the sector pad group further includes at least one connection via extending through the insulating layer, and the conductive adhesion layer is connected to the metal layer through at least one connection via; and in any two pads of the sector pad group, a total area of the connection vias in one pad is the same as a total area of the connection vias in the other pad.

In some embodiments, the plurality of pads in the sector pad group includes at least one auxiliary pad and one main pad;

wherein the main pad performs signal interaction with a circuit board, and the auxiliary pad does not perform signal interaction with the circuit board; the auxiliary pad does not include the connection via extending through the insulating layer, and the main pad includes the connection via extending through the insulating layer.

In some embodiments, the sector pad group includes an odd number of pads, wherein in the odd number of pads, the pad disposed in the middle is the auxiliary pad.

In some embodiments, any two pads include an equal number of connection vias, and a shape of each connection via is a parallelogram with one side extending along the first direction; and any two of the connection vias have a same dimension along both the first direction and the second direction, and the second direction is parallel to the bearing surface of the base substrate and perpendicular to the first direction.

According to another aspect of the embodiments of the present disclosure, a display panel is provided. The display panel includes a circuit board and an array substrate, pads in the array substrate is bound to the circuit board; wherein the array substrate includes:

a base substrate, and the base substrate includes a display region and a peripheral region surrounding the display region; and at least one pad group disposed in the peripheral region, wherein each of the at least one pad group includes a plurality of pads sequentially arranged along a first direction; and the at least one pad group includes a sector pad group, and the pads in the sector pad group are distributed in a sector shape.

In some embodiments, the circuit board is a chip on film (COF) device.

According to yet another aspect of the embodiments of the present disclosure, a display device is provided. The display device includes a power supply and a display panel, wherein the power supply is electrically connected to the display panel, and is configured to supply power to the display panel;

wherein the display panel includes a circuit board and an array substrate, pads in the array substrate are bound to the circuit board; the array substrate includes:

a base substrate, wherein the base substrate includes a display region and a peripheral region surrounding the display region; and at least one pad group disposed in the peripheral region, wherein each of the at least one pad group includes a plurality of pads sequentially arranged along a first direction, wherein the at least one pad group includes a sector pad group, wherein the pads in the sector pad group are distributed in a sector shape.

It should be understood that the above general description and the following detailed description are only exemplary and explanatory, and cannot limit the embodiments of the present disclosure.

BRIEF DESCRIPTION OF THE DRAWINGS

The accompanying drawings herein are incorporated into the specification and constituted a part of the specification to show embodiments conforming to the embodiments of the present disclosure, and are used to explain the principles of the embodiments of the present disclosure in combination with the specification. Apparently, the accompanying drawings in the following description show merely some embodiments of the present disclosure, and persons of ordinary skill in the art can still derive other drawings from these accompanying drawings without creative efforts.

REFERENCE NUMERALS AND DENOTATIONS THEREOF

J1—power supply, M1—display panel;
10—power supply circuit, 00—array substrate;
000—base substrate, 100—pad group, 110—pad;
111—first edge, 112—second edge, 113—third edge, 114—fourth edge, 201—main pad, 202—auxiliary pad, 301—connection via;
A—display region, B—peripheral region, C—first direction, D—second direction, E—central axis;
1101—metal layer, 1102—insulating layer, 1103—conductive adhesion layer.

DETAILED DESCRIPTION

The exemplary implementations will now be described more fully with reference to the accompanying drawings. However, the exemplary implementations can be implemented in various forms and should not be construed as a limitation to the implementations set forth herein; on the contrary, providing these implementations makes the embodiments of the present disclosure comprehensive and complete, and the concept of the exemplary implementations can be fully conveyed to those skilled in the art. The same reference signs in the accompanying drawings indicate the same or similar structures, and thus their detailed descriptions will be omitted. In addition, the accompanying drawings are only schematic illustrations of the embodiments of the present disclosure, and are not necessarily drawn to scale.

The terms "a," "an," "the," and "at least one" are used to indicate the presence of one or more elements or components; the terms "include," "comprise," and derivatives thereof are used to indicate open-ended inclusion and mean that there may be additional elements/components/etc. in addition to the listed elements/components/etc., and the terms "first," "second," "third," and the like are only used as markers and are not a limitation to the number of objects.

Hereinafter, the structure, principle, and effect of the array substrate provided by the embodiments of the present disclosure will be further explained and described with reference to the accompanying drawings.

Figure 1:
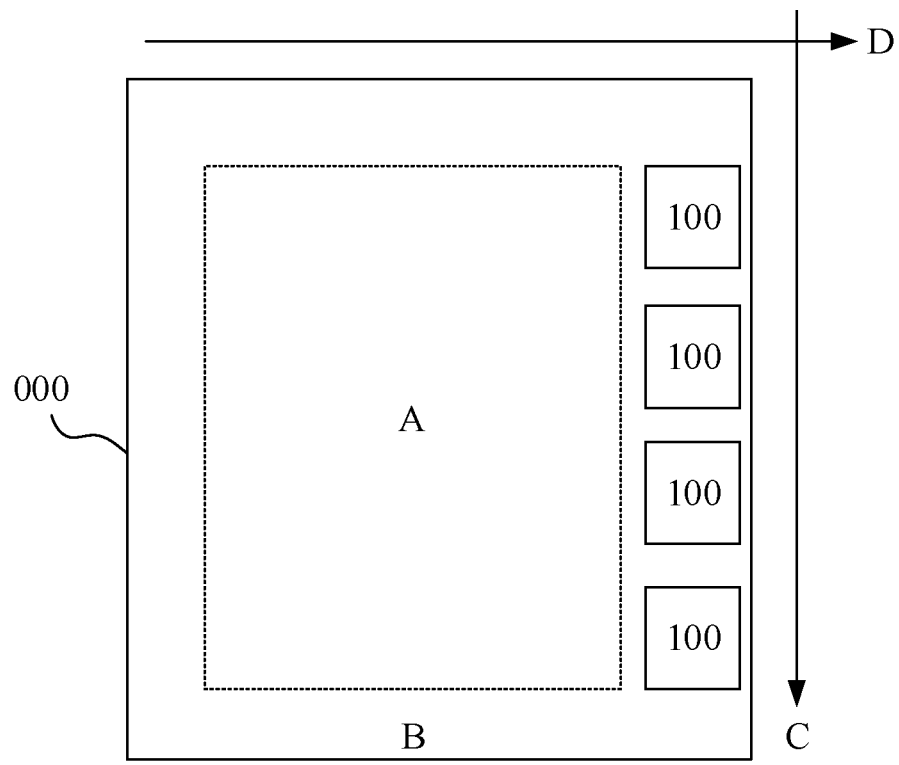
FIG. 1 is a schematic structural diagram of an array substrate according to an embodiment of the present disclosure.

An embodiment of the present disclosure provides an array substrate. As shown in FIG. 1, the array substrate includes a base substrate 000. The base substrate 000 includes a display region A and a peripheral region B surrounding the display region A. The array substrate further includes at least one pad group 100 disposed in the peripheral region of the base substrate 000. That is, the peripheral region B of the base substrate 000 may be disposed with at least one pad group 100. In combination with FIG. 2, each pad group 100 includes a plurality of pads 110 arranged sequentially along a first direction C.

Figure 2:
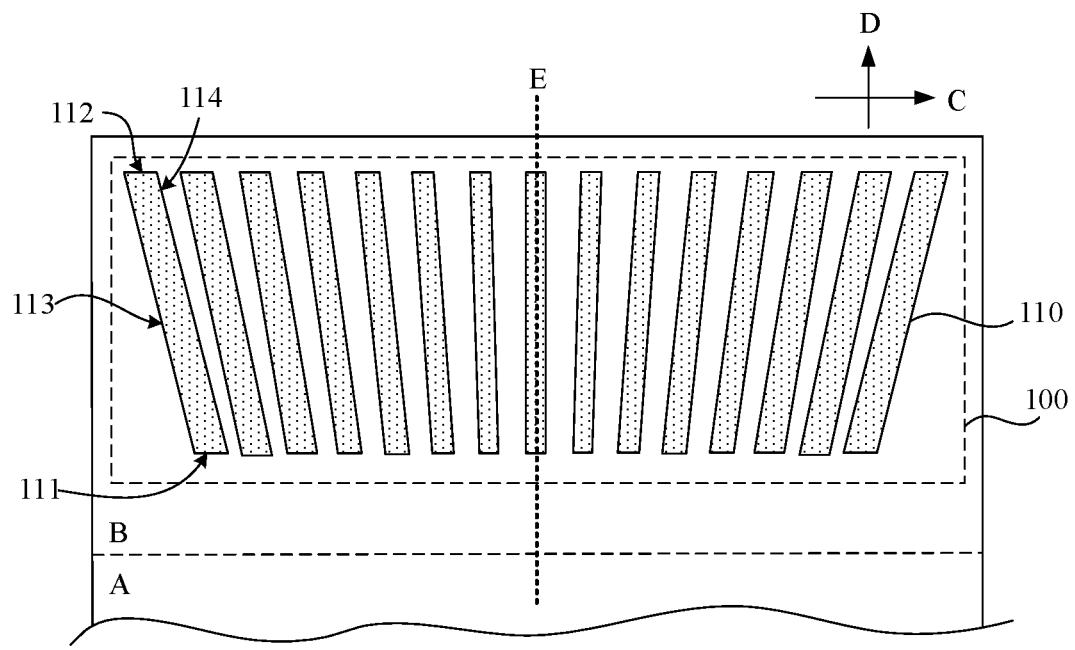
FIG. 2 is a schematic structural diagram of another array substrate according to an embodiment of the present disclosure.

In combination with FIG. 2, at least one pad group 100 described in the embodiments of the present disclosure includes the sector pad group 100, and the pads 110 in the at least one pad group 100 are distributed in a sector shape.

That is, assuming that the array substrate includes a plurality of pad groups 100, in some implementations, a part of pad groups 100 in the plurality of pad groups 100 may be the sector pad group 100 shown in FIG. 2. That is, in a part of pad groups, the pads 110 may be distributed in the sector shape, and others may not be distributed in the sector shape. In some embodiments, in the plurality of pad groups 100 in the array substrate, each pad group 100 may be the sector pad group 100 as shown in FIG. 2. That is, for the plurality of pad groups 100 in the array substrate, the pads 110 in any one of the pad groups 100 may be distributed in the sector shape.

In the embodiments of the present disclosure, for the convenience of description, the pad group 100 in which the pads 110 are distributed in the sector shape is defined as the sector pad group 100 described in the above embodiments, and the pad group 100 in which each pad 110 is not distributed in the sector shape is defined as a regular pad group. All of the pad groups 100 in the array substrate of the embodiments of the present disclosure may be the sector pad group 100. Alternatively, in all the pad groups 100, a part of pad groups 100 may be the sector pad group 100 and the other part may be the regular pad group 100. That is, at least one sector pad group 100 is included in the pad groups 100 of the array substrate in the embodiments of the present disclosure.

In addition, in combination with FIG. 2, in some embodiments, the sector shape may indicate the sector pad group 100 has a central axis E that is parallel to a second direction D, and the second direction D is perpendicular to the first direction C. The sector pad group 100 is symmetrically distributed around the central axis E. For example, assuming that the sector pad group 100 has an odd number of pads 110, an extension direction of the middle pad 110 may be the second direction D. Assuming that the sector pad set 100 has an even number of pads 110, the middle two pads 110 may be symmetrically distributed around the central axis E.

In this case, when the sector pad group 100 is bonded to a circuit board, an alignment between the sector pad group 100 and the circuit board may be adjusted along the first direction C, and the alignment between the sector pad group 100 and the circuit board may be further adjusted along the second direction D perpendicular to the first direction C, thereby improving the flexibility and adjustable range of the alignment between the sector pad group 100 and the circuit board, making a more accurate alignment state between the sector pad group 100 and the circuit board, reducing alignment errors, dimension error and pre-shrinking error of the pins on the circuit board, and reducing probability of miss bonding to improve the bonding yield between the array substrate and the circuit board.

In summary, the embodiments of the present disclosure provide an array substrate. The array substrate includes at least one pad group, wherein each pad group includes a plurality of pads arranged along a first direction in sequence, and at least one pad group includes a sector pad group in which the pads are distributed in a sector shape. Therefore, the alignment between the sector pad group and the circuit board may be adjusted not only along the first direction, but also along the second direction perpendicular to the first direction, so as to ensure that the alignment precision of the sector pad groups and the circuit board is good.

It should be noted that, in the embodiments of the present disclosure, the peripheral region B of the base substrate 000 may be provided with at least one bonding region, and any bonding region may be provided with a bonding pad group (i.e., the pad group 100).

In some embodiments, it can be seen in combination with FIG. 1 that, the first direction C may be parallel to a plane where the base substrate 000 is disposed, that is, the first direction C may be parallel to a bearing surface of the base substrate 000 and may further be parallel to an extension direction of any side of the base substrate 000, that is, the first direction C may be parallel to an extension direction of the sector pad group 100 proximal to an edge of the base substrate 000. Correspondingly, the second direction D which is perpendicular to the first direction C may also be parallel to the bearing surface of the base substrate 000. In this case, it can be seen in combination with FIG. 2 that the second direction D may be a direction away from the display area A.

Illustratively, as shown in FIG. 1, the base substrate 000 may be in a rectangular shape, that is, the array substrate may be in a rectangular shape. A plurality of pad groups 100 may be disposed near an edge of the base substrate 000, and the pads 110 in the pad group 100 may be arranged along an extension direction of the edge and spaced apart. Thus, in this case, the first direction C may be the extension direction of the edge.

In the embodiments of the present disclosure, the array substrate may be a drive back plate of a liquid crystal display device, or a display panel of an organic light-emitting diode (OLED) display device, or a portion of other display device including a drive back plate, which are not be specifically limited in the embodiments of the present disclosure.

In some embodiments, the array substrate of the embodiments of the present disclosure may be a high pixel density array substrate, such as an array substrate that may be a 2K display, a 4K display, an 8K display, or other high resolution displays. In the array substrates of these display products, a number of data leads is generally large. Correspondingly, a density of the pads in the pad group is large, a dimension of the pad is small, and a distance between adjacent pads is small. The binding between the pad group and the circuit board is prone to be poor. In the embodiments of the present disclosure, through adjusting an extension direction of the pad in the pad group, the pads in the pad group are in a sector shaped distribution, such that an alignment between the pad group and the circuit board is more flexible, and thus defects of binding poorly may be restrained and a binding yield between the array substrate and the circuit board is improved.

In some embodiments, the circuit board bound to the array substrate may be a flexible circuit board or a chip on film (COF) device or the like. The circuit board is subject to binding to the array substrate and interacting with the array substrate. Since the specifications of the circuit board cannot be changed arbitrarily, for example, the commonly used specifications of COF device are 35 mm, 48 mm or 70 mm, a dimension and density of the pins on the circuit board have to be compressed to meet the needs of the array substrate. Nevertheless, the embodiments of the present disclosure adjust the distribution of the pads in the pad group on the array substrate, so as to improve the bonding success rate as much as possible, and reduce the risk that the pads at the ends cannot be effectively connected to the circuit board.

In some embodiments, the pads 110 in the sector pad group 100 may be in a sector profile diverging in a direction away from the display region A. In other words, as shown in FIG. 2, in the sector pad group 100, a distance between any two adjacent pads 110 at an end proximal to the display region A is not greater than a distance between the two pads at an end away from the display region A. According to the embodiments, for dimensions between the two pads 110 at both ends of the sector pad group 100, a dimension of the one on a side proximal to the display region A is less than a dimension of the other on a side distal from the display region A. That is, for the two pads 110 at both ends of the sector pad group 100, a distance between the two pads 110 on the side proximal to the display region A is less than a distance between the two pads 110 on the side distal from the display region A.

In some embodiments, in combination with FIG. 2, an angle defined between extension directions of any two adjacent pads 110 in the sector pad group 100 may be a target angle. That is, the angle defined between the extension directions of a pair of adjacent two pads 110 may be the same as the angle defined between the extension directions of another pair of adjacent pads 110. In other words, among the pads 110 arranged in sequence along the first direction C, the extension direction of each pad 110 gradually changes. In two adjacent pads 110, the angle defined between the extension directions of the two pads 110 is a preset deflection angle defined between the two pads 110, and the plurality of preset deflection angles forming from a plurality of pads 110 are the same.

In some embodiments, in the sector pad group 100, an angle defined between the extension directions of the two pads 110 disposed at the two ends (i.e., the two extreme ends) ranges from 10 degrees to 20 degrees. That is, the angle defined between the extension directions of the two pads 110 at the two extreme ends ranges from 10 degrees to 20 degrees. In this way, the oblique angle of the pads 110 in the sector pad group 100 can be prevented from being too large to cause new bonding poorly.

In some embodiments, an angle defined between the extension direction of the pad 110 at any end (i.e., the extreme end) and the central axis E may range from 5 degrees to 10 degrees. Since the second direction D is perpendicular to the first direction C, that is, in the sector pad group 100, the angle defined between the extension direction of the pad 110 at the extreme end and the second direction D ranges from 5 degrees to 10 degrees.

In some embodiments, referring to FIG. 2, it can be seen that in the sector pad group 100, any one of the pads 110 may include a first edge 111 and a second edge 112 that are oppositely disposed to be parallel to the first direction C. That is, the first edge 111 and the second edge 112 may both extend along the first direction C. Further, the first edge 111 is disposed on a side, proximal to the display region A, of the second edge 112, that is, the first edge 111 is more proximal to the display region A relative to the second edge 112.

In some embodiments, in any two adjacent pads 110, a dimension of the first edge 111 of the pad 110 distal from the central axis E of the sector pad group 100 is greater than a dimension of the first edge 111 of the pad 110 proximal to the central axis E of the sector pad group 100. That is, along the first direction C, the farther away from the center of the sector pad set 100, the greater dimension of the first edge 111 of the pad 110. In other words, in the sector pad group 100, in the case that the pad 110 is more proximal to the end, the dimension of the first edge 111 is greater, and correspondingly, the dimension of the pad 110 closer to the end along the first direction C may be greater. In this way, when the pad 110 closer to the end is bound and aligned with the circuit board, the influence of the pre-shrinking error can be more effectively offset, and the bonding success rate of the bonding pad 110 near the end may be improved.

In some embodiments, in the sector pad group 100, the dimension of the first edge 111 of the extreme end pad 110 is 2 μm to 6 μm greater than the dimension of the first edge 11 of the pad 110 most proximal to the central axis E of the sector pad group 100. That is, along the first direction C, the dimension of the first edge 111 of the pad 110 disposed at the end of the sector pad group 100 is 2 μm to 6 μm greater than the dimension of the first edge 111 of the pad 110 most proximal to the center of the sector pad group 100. Thus, not only the influence of the pre-shrinking error can be effectively offset and improve the bonding success rate of the pad 110 near the end, but also can prevent the dimension of the pad 110 along the first direction C from increasing too much and causing new bonding errors.

In some embodiments, in the sector pad group 100, the lengths of the first edges 111 of the pads 110 may range from 25 μm to 35 μm. That is, the lengths of the first edges 111 of the pads 110 may range from 25 μm to 35 μm.

In some embodiments, in combination with FIG. 2, the first edges 111 of the pads 110 in the sector pad group 100 may be in a same line (i.e., collinear) and the second edges 112 of the pads 110 may be in a same line (i.e., collinear). In this case, the dimension of each pad 110 along the second direction D may be the same, which is beneficial to the preparation of the sector pad group 100.

In some embodiments, in the sector pad group 100, the centers of the first edges 111 of the respective pads 110 may be arranged at intervals. In other words, in any two adjacent pads 110, a distance between a center of the first edge 111 of one pad 110 and a center of the first edge 111 of the other pad 110 in one pair of adjacent pads is equal to a distance between a center of the first edge 111 of one pad 110 and a center of the first edge 111 of the other pad 110 in another pair of adjacent pads. Therefore, in the sector pad group 100, the end, proximal to the display region A, of each pad 110 may be arranged at an equal pitch, which may further facilitate the preparation of the sector pad group 100.

In some embodiments, in combination FIG. 2, in the sector pad group 100, any one of the pads 110 may also include a third edge 113 and a fourth edge 114 that are oppositely disposed to be parallel to each other. The third edge 113 may be connected to one end of the first edge 111 and one end of the second edge 112, and the fourth edge 114 may be connected to the other end of the first edge 111 and the other end of the second edge 112. That is, in the sector pad group 100, any one of the pads 110 further includes the third edge 113 and the fourth edge 114 that are connected to the first edge 111 and the second edge 112 and are oppositely disposed, and the third edge 113 and the fourth edge 114 are parallel to each other. In this way, the design and preparation of the pads 110 are facilitated, and furthermore, the distance between the pads 110 may be maintained, thereby facilitating the alignment during bonding.

Figure 3:
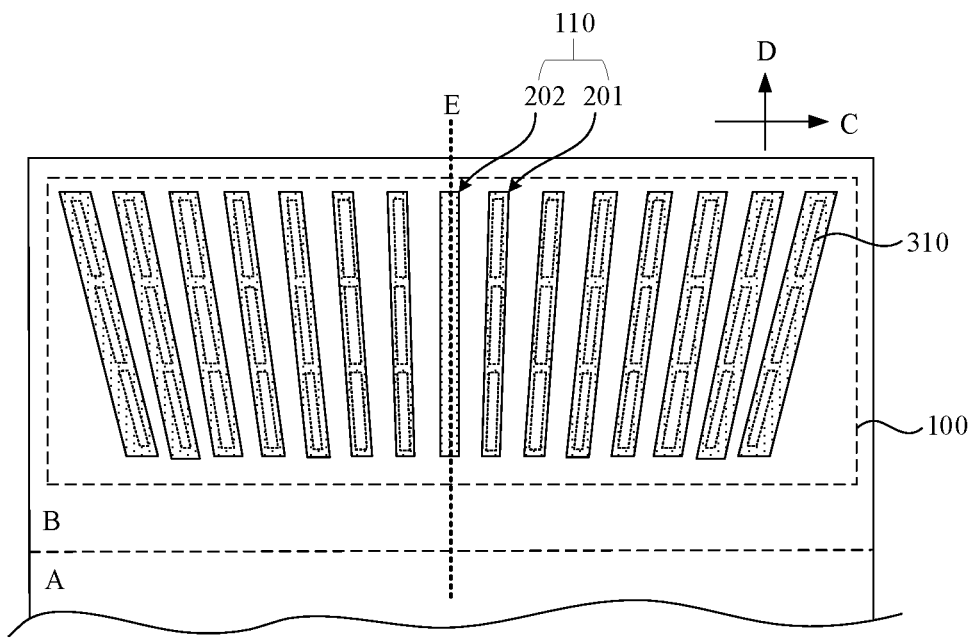
FIG. 3 is a schematic structural diagram of yet another array substrate according to an embodiment of the present disclosure.

In some embodiments, referring to FIG. 3, the pads 110 in the sector pad group 100 may at least partially be used for signal interaction with the circuit board, and these pads 110 may be defined as main pads 201. The remaining pads except the main pad 201 may not perform signal interaction with the circuit board, and these pads 110 may be defined as auxiliary pads 202. The arrangement of the auxiliary pad 202 can make the preparation of each pad 110 more convenient and improve the uniformity of each pad 110.

Understandably, the pads 110 in the sector pad group 100 may be the main pad 201, or may be part of the main pad 201 and part of the auxiliary pad 202. In some embodiments, the auxiliary pad 202 is not connected to each lead on the base substrate 000.

Figure 4:
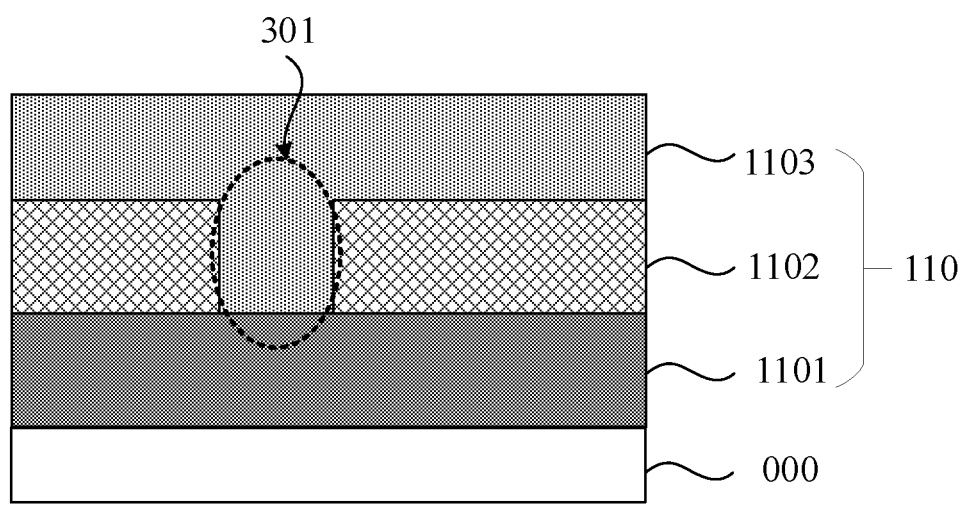
FIG. 4 is a schematic cross-sectional view of a pad according to an embodiment of the present disclosure.

In some embodiments, in the sector pad group 100, referring to FIG. 4, each pad 110 may include a metal layer 1101, an insulating layer 1102, and a conductive adhesion layer 1103 that are sequentially stacked along a direction away from the base substrate 000. And an orthographic projection of the metal layer 1101 onto the base substrate 000 may cover an orthographic projection of the conductive adhesion layer 1103 onto the base substrate 000. In addition, in combination with FIG. 3 and FIG. 4, at least one pad 110 may include at least one connection via 301 extending through the insulating layer 1102. That is, the insulating layer 1102 may be provided with at least one connection via 301 in at least a part of the pads 110. The conductive adhesion layer 1103 and the metal layer 1101 may be connected by at least one connection via 301.

Here, in any two pads 100 in the sector pad group 100, a total area of the connection via 301 in one pad 100 may be the same as a total area of the connection via 301 in the other pad 100. That is, among the pads 110 provided with the connection via 301, the total area of the connection via 301 of any two pad 110 are the same.

Understandably, referring to FIG. 4, in the pad 110 where the connection via 301 is provided, an orthographic projection of the connection via 301 onto the base substrate 000 may fall within a range of the orthographic projection of the metal layer 1101 onto the base substrate 000.

In the embodiments of the present disclosure, in combination with FIG. 3, it can be seen that each main pad 201 may include the connection via 301 extending through the insulating layer. That is, the main pad 201 may be provided with the connection via 301 to ensure that the conductive adhesion layer of the main pad 201 is electrically connected to the metal layer.

Understandably, the auxiliary pad 202 may also be provided with the connection via 301. Referring to FIG. 3, the pad 110 in the sector pad group 100 includes at least one auxiliary pad 202. The auxiliary pad 202 does not include the connection via 301 extending through the insulating layer, that is, the insulating layer of the auxiliary pad 202 is not provided with the connection via 301. In other words, in the case that the auxiliary pad 202 is disposed in the sector pad group 100, the auxiliary pad 202 may not be provided with the connection via 301.

In some embodiments, as shown in FIG. 3, the sector pad group 100 includes an odd number of pads 110, the middle pad 110 may be the auxiliary pad 202 and no connection via 301 is provided. In this way, the auxiliary pad 202 may have a flat surface to support the pins of the circuit board to which it is connected, such that a height of the auxiliary pad 202 is substantially consistent with a height of other main pads 201 when it is bonded.

In some embodiments, the metal layer 1101 described in the above embodiments may include one or more layers of metal or include an alloy. For example, in some embodiments, the metal layer may include a titanium layer, an aluminum layer, and a titanium layer that are sequentially stacked, or a titanium layer, an aluminum layer, and a titanium nitride layer that are sequentially stacked, or a molybdenum niobium layer, a copper layer, and a molybdenum niobium layer that are sequentially stacked, and so on.

In some embodiments, the conductive adhesion layer 1103 can be made of a conductive material and the conductive adhesion layer 1103 can be in stable connection with the pins of the circuit board. In this case, the bond strength between the pads 110 and the pins of the circuit board may be improved. In some embodiments of the present disclosure, a material of the conductive adhesion layer 1103 may be indium tin oxide (ITO).

In some embodiments, in the pad 110 provided with the connection via 301, a number of the connection via 301 may be multiple, and an arrangement direction of the plurality of connection via 301 in each pad 110 is consistent with the extension direction of the pad 110. Further, the shape of any one of the connection via 301 may be similar to the shape of the pad 110, e.g., a parallelogram.

In some embodiments, as shown in FIG. 3, both the shape of the pad 110 and the shape of the connection via 301 are parallelograms.

In some embodiments, the number of the connection via 301 of each pad 110 may be the same in the pads 110 provided with the connection via 301. Moreover, the dimensions of any two connection vias 301 along the first direction C may be the same and the dimensions of any two connection vias 301 along the second direction D may be the same. In this way, it can be ensured that the contact resistances of the pads 110 provided with the connection via 301 are the same.

The following examples provide an array substrate in order to further explain and illustrate the structure and effect of the array substrate of the embodiments of the present disclosure.

In the exemplary array substrate, as shown in FIG. 1 to FIG. 3, the array substrate includes a display region A and a peripheral region B surrounding the display region A. A plurality of pad groups 100 is provided in the peripheral region B, and any one of the pad groups 100 includes a plurality of pads 110 arranged along a first direction C in sequence. In one sector pad groups 100, the pads 110 are arranged along the first direction C, which is the extension direction of the base substrate 000 proximal to the edge of the sector pad group 100. Any one of the pads 110 is disposed in a parallelogram shape, which includes a first edge 111, a third edge 113, a second edge 112, and a fourth edge 114 that are connected in sequence. Here, the first edge 111 is parallel to the first direction C, and is disposed on a side, proximal to the display region A, of the second edge 112.

As shown in FIG. 2 and FIG. 3, the sector pad group 100 is disposed symmetrically around a central axis E that is perpendicular to the first direction C and parallel to the bearing surface of the base substrate 000. (2M+1) pads 110 are in the sector pad group 100, where M is a positive integer. Each pad 110 is numbered sequentially along the first direction C and recorded as pad 110P (i), wherein pad 110P(i) is the pad 110 numbered with i, 1≤i≤2M+1. The pad 110P(M+1) is the center pad 110, and its extension direction is parallel to the second direction D, that is, the extension direction is perpendicular to the first direction C.

For the pads 110P(M) to the pads 110P(1), that is, the pads disposed on the same side of the central axis E and arranged along a direction away from the central axis E, the angle defined between its extension direction and the first direction C is gradually reduced. That is, the angle defined between the extension direction and the second direction D gradually increases. For these pads 110, the distance between the end proximal to the display region A and the central axis E is less than the distance between the end distal from the display region A and the central axis E, such that the pads 110 present a sector shaped distribution with diverging along a direction away from the display region A. The angle defined between the extension direction of the pad 110P(1) and the central axis E ranges from 5 degrees to 10 degrees, such that the angle defined between the extension direction of the pad 110P(1) and the extension direction of the pad 110P(2M+1) ranges from 10 degrees to 20 degrees. In the pad 110P(M) to the pad 110P(1), the preset deflection angles of any two adjacent pads 110 are the same.

From pad 110P(M+1) to pad 110P(1), the length of the first edge 111 decreases sequentially. And among these pads 110, the reduction value of the length of the first edge 111 of any two adjacent pads 110 is the same. The length of the first edge 11 of the pad 110P(1) is 2 μm to 6 μm greater than the length of the first edge 111 of the pad 110P(M+1). In these pads 110, the centers of the first edges 111 are arranged at intervals. That is, the distance between the first edges 111 of any two adjacent pads 110 is the same.

In combination with FIG. 4, any pad 110 includes a metal layer 1101, an insulating layer 1102, and a conductive adhesion layer 1103 stacked in sequence, wherein an orthographic projection of the metal layer 1101 onto the base substrate 000 covers an orthographic projection of the conductive adhesion layer 1103 onto the base substrate 000. In the pad 110P(M) to the pad 110P(1), and the pad 110P(M+2) to the pad 110P(2M+1), the insulating layer 1102 is provided with a plurality of connection vias 301, and the pad 110P(M+1) is not provided with the connection via 301.

In the pads 110 provided with the connection via 301, an orthographic projection of the connection via 301 onto the metal layer 1101 falls within the metal layer 1101, and the number of connection vias 301 on each pad 110 is the same. The conductive adhesion layer 1103 is electrically connected to the metal layer 1101 by the connection via 301. The shape of any one of the connection vias 301 is a parallelogram whose four edges are parallel to the four edges of the pad 110, respectively. In this way, any one of the connection vias 301 includes two oppositely disposed edges extending along the first direction C, and a distance between the two edges along the second direction D is the preset height of the connection via 301. For any two connection vias 301, the lengths of the edges extending along the first direction C are the same, and the preset heights of any two connection vias 301 are the same. In this way, for the pads 110 provided with the connection via 301, a total area of the respective connection via 301 is the same, which may ensure that the contact resistance of each pad 110 is consistent.

In summary, the embodiments of the present disclosure provide an array substrate. The array substrate includes at least one pad group, wherein each pad group includes a plurality of pads arranged along a first direction in sequence, and at least one sector pad group includes a sector pad group where the pads is distributed in a sector shape. Therefore, the alignment between the sector pad group and the circuit board can be adjusted not only along the first direction, but also along the second direction perpendicular to the first direction, so as to ensure that the alignment precision between the sector pad group and the circuit board is good.

Figure 5:
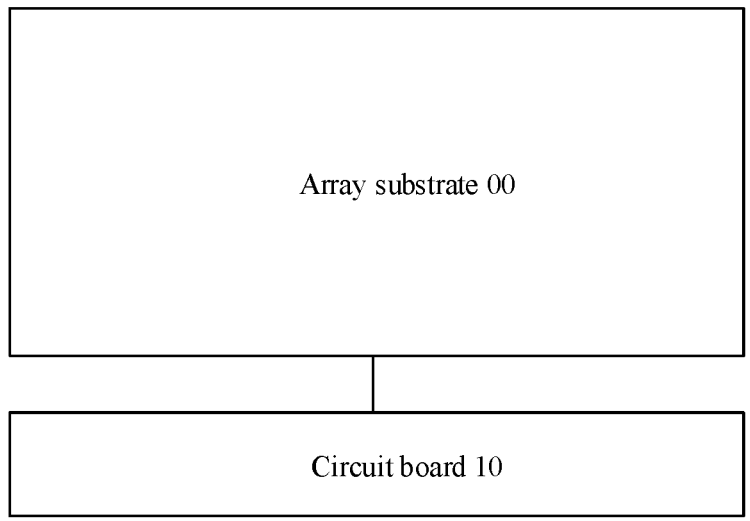
FIG. 5 is a schematic structural diagram of a display panel according to an embodiment of the present disclosure.

FIG. 5 is a schematic structural diagram of a display panel according to an embodiment of the present disclosure. As shown in FIG. 5, the display panel may include a circuit board 10 and an array substrate 00. The array substrate 00 may be any array substrate shown in FIG. 1 to FIG. 3.

Here, in combination with FIG. 2, the pads 110 in the array substrate 00 may be bound to the circuit board 10. In some embodiments, the circuit board 10 may be a chip on film (COF) device as described in the embodiments described above.

Figure 6:
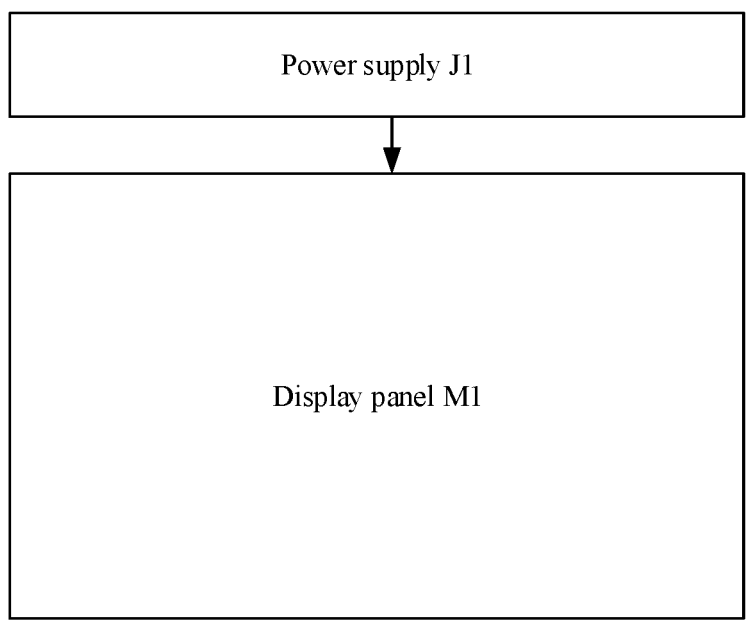
FIG. 6 is a schematic structural diagram of a display device according to an embodiment of the present disclosure.

FIG. 6 is a schematic structural diagram of a display device according to an embodiment of the present disclosure. As shown in FIG. 6, the display device may include a power supply J1 and a display panel M1. The display panel M1 may be the display panel shown in FIG. 5.

The power supply J1 may be electrically connected with the display panel M1, and the power supply J1 may be used for supplying power to the display panel M1.

In some embodiments, the display device is an OLED display device, an active-matrix organic light-emitting diode (AMOLED) display device, a liquid crystal display (LCD) device, a mobile phone, a tablet computer, a television, a display, a notebook computer, a navigator, or any other product or component with a display function.

Other embodiments of the present application would be apparent to those skilled in the art from consideration of the specification and practice disclosed herein. The present disclosure is intended to cover any variations, uses, or adaptations of the present disclosure following the general principles thereof and including such departures from the present application as coming within common knowledge or customary technical means in the art. The description and the embodiments are only regarded as exemplary, and the true scope and spirit of the embodiments of the present disclosure are subject to the appended claims.

What is claimed is:

1. An array substrate, comprising: a base substrate, wherein the base substrate comprises a display region and a peripheral region surrounding the display region; and at least one pad group disposed in the peripheral region, wherein each of the at least one pad group comprises a plurality of pads sequentially arranged along a first direction, the at least one pad group comprises a sector pad group, and the pads in the sector pad group are distributed in a sector shape, wherein in the sector pad group, any one of the pads comprises a first edge and a second edge that are oppositely disposed and extended along the first direction, and the first edge is more proximal to the display region relative to the second edge; and in the any two adjacent pads, a dimension of the first edge of the pad distal from a central axis of the sector pad group is greater than a dimension of the first edge of the pad proximal to the central axis of the sector pad group.

2. The array substrate according to claim 1, wherein the first direction is parallel to a bearing surface of the base substrate and an extension direction of any side of the base substrate.

3. The array substrate according to claim 1, wherein in the sector pad group, a distance between any two adjacent pads at an end proximal to the display region is not greater than a distance between the two pads at an end distal from the display region.

4. The array substrate according to claim 3, wherein an angle defined between extension directions of any two adjacent pads in the sector pad group is a target angle.

5. The array substrate according to claim 1, wherein in the sector pad group, an angle defined between extension directions of two pads disposed at both ends ranges from 10 degrees to 20 degrees.

6. The array substrate according to claim 1, wherein an angle defined between an extension direction of the pad at any end and a second direction ranges from 5 degrees to 10 degrees, wherein the second direction is parallel to a bearing surface of the base substrate and perpendicular to the first direction.

7. The array substrate according to claim 1, wherein in the sector pad group, a dimension of the first edge of the pad disposed at any end is 2 μm to 6 μm greater than a dimension of the first edge of the pad most proximal to the central axis of the sector pad group.

8. The array substrate according to claim 1, wherein a length of the first edge ranges from 25 μm to 35 μm.

9. The array substrate according to claim 1, wherein in the sector pad group, a distance between a center of the first edge of one pad and a center of the first edge of the other pad in one pair of adjacent pads is equal to a distance between a center of the first edge of one pad and a center of the first edge of the other pad in another pair of adjacent pads.

10. The array substrate according to claim 1, wherein in the sector pad group, the first edges of the pads are in a same line, and the second edges of the pads are in a same line.

11. The array substrate according to claim 1, wherein in the sector pad group, any one of the pads further comprises a third edge and a fourth edge that are oppositely disposed to be parallel to each other, the third edge is connected to one end of the first edge and one end of the second edge, and the fourth edge is connected to the other end of the first edge and the other end of the second edge.

12. The array substrate according to claim 1, wherein each of the pads of the sector pad group comprises a metal layer, an insulating layer, and a conductive adhesion layer stacked sequentially along a direction away from the base substrate, an orthographic projection of the metal layer onto the base substrate covers an orthographic projection of the conductive adhesion layer onto the base substrate; and at least one of the pads of the sector pad group further comprises at least one connection via extending through the insulating layer, and the conductive adhesion layer is connected to the metal layer through at least one connection via; and in any two pads of the sector pad group, a total area of the connection vias in one pad is the same as a total area of the connection vias in the other pad.

13. The array substrate according to claim 12, wherein the plurality of pads in the sector pad group comprises at least one auxiliary pad and one main pad;

wherein the main pad performs signal interaction with a circuit board, and the auxiliary pad does not perform signal interaction with the circuit board; the auxiliary pad does not comprise the connection via extending through the insulating layer, and the main pad comprises the connection via extending through the insulating layer.

14. The array substrate according to claim 13, wherein the sector pad group comprises an odd number of pads, wherein in the odd number of pads, the pad disposed in the middle is the auxiliary pad.

15. The array substrate according to claim 14, wherein the first direction is parallel to the bearing surface of the base substrate and the extension direction of any side of the base substrate;

in the sector pad group, a distance between any two adjacent pads at an end proximal to the display region is not greater than a distance between the two pads at an end distal from the display region;
an angle defined between extension directions of any two adjacent pads in the sector pad group is a target angle; an angle defined between extension directions of two pads disposed at both ends ranges from 10 degrees to 20 degrees; and an angle defined between the extension direction of the pad at any end and a second direction ranges from 5 degrees to 10 degrees, wherein the second direction is parallel to the bearing surface of the base substrate and perpendicular to the first direction;
any one of the pads comprises a first edge and a second edge that are oppositely disposed and extended along the first direction, and the first edge is more proximal to the display region relative to the second edge; and in the any two adjacent pads, a dimension of the first edge of the pad distal from a central axis of the sector pad group is greater than a dimension of the first edge of the pad proximal to the central axis of the sector pad group; wherein in the sector pad group, a dimension of the first edge of the pad disposed at any end is 2 μm to 6 μm greater than a dimension of the first edge of the pad most proximal to the central axis of the sector pad group; wherein a length of the first edge ranges from 25 μm to 35 μm; wherein in the sector pad group, a distance between a center of the first edge of one pad and a center of the first edge of the other pad in one pair of adjacent pads is equal to a distance between a center of the first edge of one pad and a center of the first edge of the other pad in another pair of adjacent pads; the first edges of pads are in a same line, and the second edges of pads are is in a same line;

any one of the pads further comprises a third edge and a fourth edge that are oppositely disposed to be parallel to each other, the third edge is connected to one end of the first edge and one end of the second edge, and the fourth edge is connected to the other end of the first edge and the other end of the second edge; any two pads comprises an equal number of connection vias, and a shape of each connection via is a parallelogram with one side extending along the first direction; and any two of the connection vias have a same dimension along both the first direction and the second direction, wherein the second direction is parallel to the bearing surface of the base substrate and perpendicular to the first direction.

16. The array substrate according to claim 12, wherein any two pads both comprise an equal number of connection vias, and a shape of each connection via is a parallelogram with one side extending along the first direction;

wherein any two of the connection vias have a same dimension along both the first direction and a second direction, wherein the second direction is parallel to the bearing surface of the base substrate and perpendicular to the first direction.

17. A display panel, comprising a circuit board and an array substrate, pads in the array substrate being bound to the circuit board; wherein the array substrate comprises: a base substrate, and the base substrate comprises a display region and a peripheral region surrounding the display region; and at least one pad group disposed in the peripheral region, wherein each of the at least one pad group comprises a plurality of pads sequentially arranged along a first direction, and at least one pad group includes a sector pad group, and the pads in the sector pad group are distributed in a sector shape, wherein in the sector pad group, any one of the pads comprises a first edge and a second edge that are oppositely disposed and extended along the first direction, and the first edge is more proximal to the display region relative to the second edge; and in the any two adjacent pads, a dimension of the first edge of the pad distal from a central axis of the sector pad group is greater than a dimension of the first edge of the pad proximal to the central axis of the sector pad group.

18. The display panel according to claim 17, wherein the circuit board is a chip on film (COF) device.

19. A display device, comprising a power supply and a display panel, wherein the power supply is electrically connected to the display panel, and is configured to supply power to the display panel;

wherein the display panel comprises a circuit board and an array substrate, pads in the array substrate are bound to the circuit board;
wherein the array substrate comprises:
a base substrate comprising a display region and a peripheral region surrounding the display region; and
at least one pad group disposed in the peripheral region, wherein each of the at least one pad group comprises a plurality of pads sequentially arranged along a first direction, wherein the at least one pad group includes a sector pad group, and the pads comprised in the sector pad group are distributed in a sector shape.

* * * * *